United States Patent
Kopp et al.

(10) Patent No.: US 7,242,702 B2
(45) Date of Patent: Jul. 10, 2007

(54) THIN-FILM LARGE-AREA COHERENT LIGHT SOURCE, FILTER AND AMPLIFIER APPARATUS AND METHOD

(75) Inventors: Victor Il'ich Kopp, Flushing, NY (US); Zhao-Qing Zhang, Kowlong (HK); Azriel Zelig Genack, New York, NY (US)

(73) Assignee: Chiral Photonics, Inc., Clifton, NJ (US)

( * ) Notice: Subject to any disclaimer, the term of this patent is extended or adjusted under 35 U.S.C. 154(b) by 0 days.

(21) Appl. No.: 10/751,282

(22) Filed: Jan. 2, 2004

(65) Prior Publication Data

US 2004/0156406 A1 Aug. 12, 2004

Related U.S. Application Data

(63) Continuation-in-part of application No. 09/755,859, filed on Jan. 5, 2001, now abandoned.

(60) Provisional application No. 60/175,007, filed on Jan. 7, 2000, provisional application No. 60/182,125, filed on Feb. 12, 2000.

(51) Int. Cl.
    *H01S 3/14* (2006.01)

(52) U.S. Cl. .......................................... 372/39; 372/75
(58) Field of Classification Search ................ 372/39, 372/75, 43.01
See application file for complete search history.

(56) References Cited

U.S. PATENT DOCUMENTS 6,404,789 B1 * 6/2002 Kopp et al. .................... 372/39

* cited by examiner

*Primary Examiner*—Minsun Oh Harvey
*Assistant Examiner*—Tuan N. Nguyen
(74) *Attorney, Agent, or Firm*—Edward Etkin, Esq.

(57) ABSTRACT

Lasing at the edge of the reflection band or at a defect state within the reflection band of a thin one-dimensional feedback structure is used to create a large-area, thin-film laser source with transverse dimensions that can be much greater than the film thickness. Angular confinement of radiation propagating perpendicular to the layers leads to a spreading of the beam inside the medium which is much greater than the diffraction divergence. This enhances the spatial extent of correlation at the output surface of the thin film. When a pump source induces gain at the lasing threshold in a wide region, a spatially coherent monochromatic light beam is emitted perpendicular to the film surface from the entire gain region. Alternate embodiments of the present invention include a passive spatial filter and an active amplifier.

21 Claims, 8 Drawing Sheets

THIN-FILM LARGE-AREA COHERENT LIGHT SOURCE, FILTER AND AMPLIFIER APPARATUS AND METHOD

RELATED APPLICATIONS

This application is a continuation-in-part (CIP) application claiming priority from co-pending U.S. patent application Ser. No. 09/755,859 entitled "Thin-Film Large-Area Coherent Light Source, Filter, and Amplifier Apparatus and Method" which was filed on Jan. 5, 2001 now abandoned, which in turn claims priority from U.S. Provisional Patent Application Ser. No. 60/175,007 entitled "Thin-Film Large-Area Coherent Light Source and Filter Apparatus and Method" which was filed on Jan. 7, 2000, and from U.S. Provisional Patent Application Ser. No. 60/182,125 entitled "Improved Thin-Film Large-Area Coherent Light Source and Filter Apparatus and Method" which was filed on Feb. 12, 2000.

FIELD OF THE INVENTION

The present invention relates generally to lasers based on feedback structures, and more particularly to large-area, thin-film laser sources that may be optionally utilized as filters and amplifiers.

BACKGROUND OF THE INVENTION

Semiconductor coherent laser beam sources have found many industrial and commercial applications in recent years. For example, lasers are used in telecommunications, in optically readable media pickups that are used in CD players, CD ROM drives and DVD players and in medical imaging. In particular wide area coherent lasers would be very useful in holographic displays, in communication systems and in information processing. However, previously known semiconductor lasers have a number of disadvantages. For example, traditional semiconductor lasers, such as ones used in CD players, emit light from the edge of a chip, so it is necessary to cleave a wafer into chips and package the chip before knowing if the laser functions properly. Other types of light sources, such as LEDs do not provide the performance needed for certain applications.

Vertical Cavity Surface Emitted Lasers (hereinafter "VCSELs") have been developed to address the need for a more advanced, higher quality laser that can function well in a variety of applications. VCSELs are comprised of a gain medium between two periodic stacks of binary-layered medium, giving a periodic profile of the refractive index variation. VCSELs combine the performance advantages of edge-emitting lasers at costs comparable to LED solutions. VCSELs emit light vertically from the wafer surface, like LEDs, which means their fabrication and testing is fully compatible with standard I.C.s procedures and equipment, and also means that arrays of VCSELs are feasible. Additionally, VCSELs are much faster, more efficient, and produce a smaller divergence beam than LEDs.

The VCSELs structure leads to a host of performance advantages over conventional semiconductor lasers.

1) small size
2) low power consumption
3) 2-dimensional array capabilities

In contrast to conventional edge-emitting semiconductor lasers, the surface-emitting VCSELs has a radially symmetric Gaussian near-field, greatly simplifying coupling to optical elements or fibers. In addition, VCSELs technology allows the fabrication of two-dimensional laser arrays.

However, VCSELs suffer from a number of disadvantages. The manufacture of VCSELs requires sophisticated and expensive microfabrication. Since single-pass gain in thin layer semiconductor lasers is low, VCSELs incorporate highly reflective dielectric stacks which are integrated into the laser as Bragg reflectors. These consist of alternating layers of dielectric material, which are grown using methods of molecular beam epitaxy (MBE). This ensures a close match of the atomic lattice structures of adjacent layers. Alternating atomically ordered layers of materials with different electronic characteristics are thereby produced. The interfaces between the layers must be digitally graded and doped to reduce the electrical resistance.

Much work has been done to improve the performance of VCSELs by increasing the number of layers and/or the dielectric constant difference between alternating layers. However, this approach makes the fabrication more expensive and difficult. There is also a limit to the number of layers determined by the absorption in these layers. While VCSELs can be manufactured in two-dimensional arrays, there has been great difficulty in achieving uniform structure over large areas and in producing large area arrays. The materials typically used for VCSELs do not have the desired low absorption and high index contrast over a broad frequency range. In particular, it is difficult to achieve high reflectivity in the communication band around 1.5 microns.

In addition, VCSELs cannot be tuned in frequency since their periods cannot be changed. The density of photon modes is not changed appreciably by use of low index contrast multilayer Bragg reflector and the gain cannot be improved in a VCSELs system as compared to that in an ordinary laser cavity. Also, an external device must be used to control the polarization of the light.

With respect to wider area coherent lasers, since the maximum excitation energy is proportional to the laser area, large-area thin-film devices provide a new approach for high-power lasers. While it would appear that VCSELs are the best candidate for wide area lasing in a 1-D periodic structure, high order transverse modes arise in small-diameter VCSELs, while in large-diameter VCSELs spontaneous filamentation results from structural nonuniformities. Furthermore, in all previously known lasers coherence width is much smaller than longitudinal size (VCSELs) or mirror distances (in conventional lasers). It should also be noted that VCSELs inherently do not allow for large area coherence because their length is greater than the diameter, and because they are comprised of alternating layers with low index contrast. This requires a greater number of layers and hence a thicker structure.

It would thus be desirable to provide a laser apparatus and method that produces a wide-area coherent laser beam superior to other previously known wide area coherent laser beam sources. It would further be desirable to provide a wide area coherent lasing apparatus and method that is configurable for using in filtering and amplification applications.

SUMMARY OF THE INVENTION

This invention relates to use of feedback (for example, chiral or dielectric layered) structures combined with an excitable light-emitting material to produce coherent lasing in an area wider than the thickness of the structure. The novel laser apparatus comprises a feedback structure with top and bottom surfaces having a predetermined profile of refractive index variation between the top and bottom surfaces. The profile is selected to produce a photonic mode, corresponding to a wavelength at which lasing is desirable, that is separated from the nearest lower frequency photonic mode by a predetermined separation frequency. This may be accomplished by selecting a profile for the feedback structure that produces a photonic stop band. The feedback structure consists of (a) a single chiral layer or multiple layers of dielectric materials that include an excitable light-emitting layer, or, of (b) multiple chiral or other dielectric material layered regions doped with an excitable light-emitting material. The novel laser apparatus further includes an excitation source that, when applied to the feedback structure, causes the light-emitting material to emit electromagnetic radiation, such that wide area coherent lasing at a lasing wavelength is produced in a direction perpendicular to the surface of the feedback structure. If the profile is configured to produce a photonic stop band in th the structure, the lasing wavelength will be within, or at an edge of the photonic stop band. The profile may be further configured to produce a photonic stop band with a defect such that lasing advantageously occurs at a wavelength corresponding to a localized photonic state within the photonic stop band that preferably corresponds to a location of maximum gain within the feedback structure.

The feedback structure utilized in the inventive apparatus should be configured, for example by selecting a specific refractive index variation profile for the structure during fabrication, to produce a photonic mode of a particular frequency F (corresponding to the desirable lasing wavelength) that is separated from a nearest lower frequency photonic mode by frequency greater than determined in accordance with a following expression: c/2TN, wherein c is the speed of light, T is said thickness of said feedback structure and N is said average refractive index of said feedback structure. The photonic mode may correspond to a mode at the edge of a photonic stop band (or to a defect mode if the profile is configured to produce a defect in the structure) when the structure is based on chiral or periodic layered dielectric materials. Alternately, the photonic mode may correspond to one of photonic modes produced in a feedback structure composed of random variation of binary dielectric layers.

The excitation source may be an electrical power source connected to the feedback structure via two or more electrodes or an optical pump if the feedback structure is configured with an optically excitable material. In accordance with the present invention, the coherence area of the lasing emission remains stable even at output of the excitation source substantially higher than the lasing threshold.

In another embodiment of the present invention, the inventive apparatus is utilized as a passive spatial filter without requiring an active excitable material or a power source. A light source emits light at the frequency F which encompasses a range of wave vectors. The feedback structure only permits light of the particular frequency F that is within a narrow range in angle about the normal vector to the surface of the structure. Thus, the inventive apparatus can be advantageously utilized as a passive spatial filter for filtering out oblique components of light of the predefined frequency F and thereby expanding the output beam.

In yet another embodiment, the apparatus of the present invention can be utilized as an active amplifier. A light source emits light into a feedback structure. Variable gain is applied by a variable gain source via electrodes attached to the feedback structure. Optionally, if the feedback structure is configured with an optically excitable material, the variable gain source may be an optical pump. Preferably, the variable gain is applied below the lasing threshold such that light is amplified. In accordance with the present invention the gain may be varied to advantageously control the amplification and coherence area of the resulting beam.

In an alternate embodiment of the present invention, instead of a typical light source, a light diffusing panel ("LDP") light source may be advantageously utilized in the previously described embodiments of the present invention where the feedback structure is optically pumped. The LDP light source comprises one or more light-emitters, such as LED strips, for emitting light in a particular direction, and a diffusing panel configured, such that when light is emitted from one or more emitters into one or more edges of the diffusing panel, light is emitted from the panel surface perpendicular to the emission direction of the light-emitter. The diffuser panel may be selected from a variety of diffuser panels as a matter of design choice—for example the diffuser panel may be a light shaping diffuser holographic panel.

In an alternate lasing apparatus embodiment of the present invention, the LDP light source is utilized as an optical pump. The LDP light source emits light at a distributed substantially normal vector into a feedback structure. The feedback structure is preferably doped with optically excitable materials. Variable gain is applied by adjusting one or more emitters of the LDP light source. Preferably, the variable gain is applied above a lasing threshold such that lasing light is produced. Because the diffuser panel only emits light at an substantially normal vector, the structure provides an excellent efficient wide-area coherent lasing medium. In accordance with the present invention even if gain is varied above the lasing threshold the coherence area of the resulting lasing beam remains stable.

The inventive apparatus and method advantageously overcome the drawbacks of previously known edge-emitting lasers and VCSELs by providing wide-area coherent lasing with transverse dimensions that can be much greater than the thickness of the feedback structure utilized in the inventive apparatus. This is possible at the laser wavelength because only a single narrow mode of radiation exists over a wide angular range centered at the normal direction. The spread of optical coherence is diffusion-like, resulting in a beam width, which is proportional to the square root of the photon dwell time. The use of the inventive large-area, thin-film laser facilitates heat extraction and high power operation. Thus, the properties of the inventive apparatus may enable lightweight optical sources for free-space communication, coherent backlighting for 3-D holographic and projection displays, and therapeutic irradiation of large areas of skin among other applications.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote elements throughout the several views.

DETAILED DESCRIPTION OF PREFERRED EMBODIMENTS

Figure 1A:
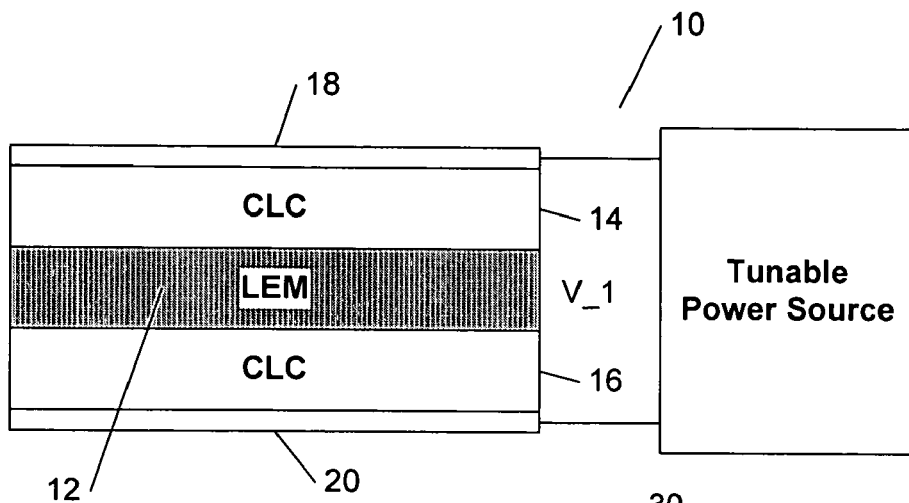
FIG. 1A is a schematic diagram of a first embodiment of a feedback laser of the present invention wherein the feedback laser is electrically pumped.

Before describing the present invention in greater detail, it would be helpful to provide definitions of common terms utilized in the dielectric lasing art. "Chiral" materials are not symmetrical, that is they are not identical to their mirror images. Cholesteric materials, such as cholesteric liquid crystals (hereinafter "CLCs"), have multiple molecular layers where molecules in the different layers are oriented on average at a slight angle relative to molecules in other layers. Molecules in consecutive layers are rotated slightly relative to those in the preceding layer. Thus, the average direction of the molecules, known as a "director", rotates helically throughout the cholesteric material. A pitch of a cholesteric material is defined as a thickness of the material in which the director rotates a full 360 degrees. Cholesteric structures also have a property called "handedness"—they may be right-handed or left-handed depending on the direction of rotation of the molecules from layer to layer. The handedness of a cholesteric structure influences the circular polarization and amplitude of light passing through the structure.

In accordance with the present invention, a feedback structure having a top and bottom surface is configured with a predefined profile of refractive index variation between its top and bottom surfaces (hereinafter "profile") to produce a photonic mode, corresponding to a wavelength at which lasing is desirable, that is separated from the nearest lower frequency photonic mode by a predetermined separation frequency. The easiest way to accomplish this is to select the profile to produce, in the feedback structure, a particular reflection band (hereafter referred to as a "photonic stop band")—a range of wavelengths for a given polarization of light where there is no transmission of light through the structure due to reflection. The specific range of these wavelengths is also determined by specific values in the refractive index variation profile. Such profiles may be readily implemented in periodic structures, such as chiral structures or structures composed of dielectric or chiral layers.

It should be noted that the below-described embodiments of the present invention discuss and refer to feedback structures having profiles that produce photonic stop bands by way of example only. As a matter of design choice, without departing from the spirit of the invention, the profile may be selected to produce a feedback structure with a photonic mode with desirable separation from the nearest lower frequency photonic mode without forming a photonic stop band in the feedback structure. Such a profile may be readily implemented in random layered dielectric or chiral structures. Thus, the presence of a photonic stop band in a feedback structure is not a necessity for operation of the present invention, rather, the key factor is presence of a photonic mode that is separated from the nearest lower frequency mode by a desired separation frequency.

Assuming a feedback structure with a profile that produces a photonic stop band in the structure is utilized, at the edge of the photonic stop band gap there are a series of narrow photonic states (or modes) at the peak of which transmission of light reaches unity. The spectral width of these states is proportional to the inverse of the dwell time for the photons within the feedback structure. The long dwell time of photons in spectrally narrow states facilitates lasing at the frequency of these modes in activated materials since emitted photons are given greater opportunity to stimulate emission before they emerge from the feedback structure. Since the photon lifetime is longest for the state closest to the photonic stop band edge and falls rapidly with state number from the edge, lasing occurs in the wavelength corresponding to the first state or corresponding to a few states closest to the photonic stop band edge. This is taught by the commonly-assigned "Stop Band Laser" patent application of A. Z. Genack et al. (S/N 09/302,630, filed Apr. 30, 1999) which discloses that in a generally homogeneous CLC structure lasing advantageously occurs at the edges of the photonic stop band due to the higher density of photonic states therein.

When a defect, such as a spacing, pitch shift, or additional layer of a foreign substance is introduced into a feedback structure, or when the feedback structure is a CLC and comprises two or more CLC films having different pitches or refractive indices, then an additional localized photonic state or number of photonic states may be introduced into the photonic stop band. Maximum efficiency lasing occurs at the frequency of the localized state. An exemplary defect mode, is shown as a centrally positioned localized state in the top transmission spectrum graph of FIG. 5.

However, more commonly a partial gap with a reduced density of states is created in which the propagation of electromagnetic waves is forbidden only over some range of directions for some polarization. For instance, in feedback structures consisting of layered materials with the dielectric constant periodically arranged in the direction normal to the layers, a photonic stop band can exist for electromagnetic propagation in the normal direction. Away from the normal direction, the mid-gap position will shift to higher frequency (see FIGS. 5 and 6) and for sufficiently large angular shift the gap in the density of states in the frequency domain in the direction vanishes. As a result (as will be described below) large coherence area lasing occurs perpendicular to the surface of the layered material. Lasing over a wide coherence area may also occur at a specific angle relative to the normal. At this angle, the lower band edge is shifted up to a value equal to the frequency of the upper band edge for radiation propagating perpendicular to the sample.

Electromagnetic energy in a mode at the edge of a stop band or in a defect state within the stop band has an enhanced residence time in the medium. This leads to efficient low-threshold lasing in such modes in activated media. A example of a defect state within the stop band is the Vertical Cavity Surface Emitting Laser (VCSEL), in which a defect layer is introduced in the middle of a periodically layered sample to produce lasing at a defect mode of the stop band. In a feedback medium without a defect, lasing can also occur at the edge of a stop band. This has been demonstrated in CLCs, which are one-dimensional feedback systems with a chiral structure in the dielectric constant. In these structures a stop band exists for circularly polarized light that has the same sign of rotation as the CLC structure. Since the gap position shifts to higher frequency with increasing angle, the mode at the high frequency edge of the stop band is relatively isolated from other modes at oblique angles as compared to the mode at the low frequency edge of the stop band. This isolation serves to reduce the number of modes that can compete to be excited by stimulated emission and consequently leads to lasing in a single mode or a small number of modes.

In order to investigate the properties of this lasing mode in the presence of gain for CLC samples, a novel theoretical transmission study was performed. The sample was modelled as a set of anisotropic (CLC) layers. All layers were of equal thickness and had a thickness which is significantly smaller than the wavelength of the incident light. The direction of the molecular axis was rotated between successive layers within the planes of the layers by the same small angle. A normally incident circularly polarized one-dimensional Gaussian beam with the same sign of rotation as the CLC was incident upon the sample. The beam was constructed by superimposing many plane waves at the same frequency at different angles of incidence in a plane perpendicular to the layers. The amplitudes of these plane waves followed a Gaussian distribution in the angle of incidence centred about the normal. The superposition of these plane waves lead to a one-dimensional Gaussian wave with wave vector centred upon the perpendicular direction, which is taken to be the x-axis. In the direction perpendicular to the x-axis, the wave was homogeneous in the plane. The properties of the transmitted waves were calculated with use of a well known 4×4 transfer-matrix method first introduced by Teitler and Henvis for anisotropic stratified media. This method was later developed and applied to CLCs and other liquid crystals by Berreman and also by Wohler et al. The method allowed calculation of the properties of the transmitted wave for each incident plane wave at a given incident angle. The superposition of all transmitted plane waves weighted by the Gaussian distribution of the incident beam produced the transmitted wave. The main results of the numerical study are given below.

Figure 5:
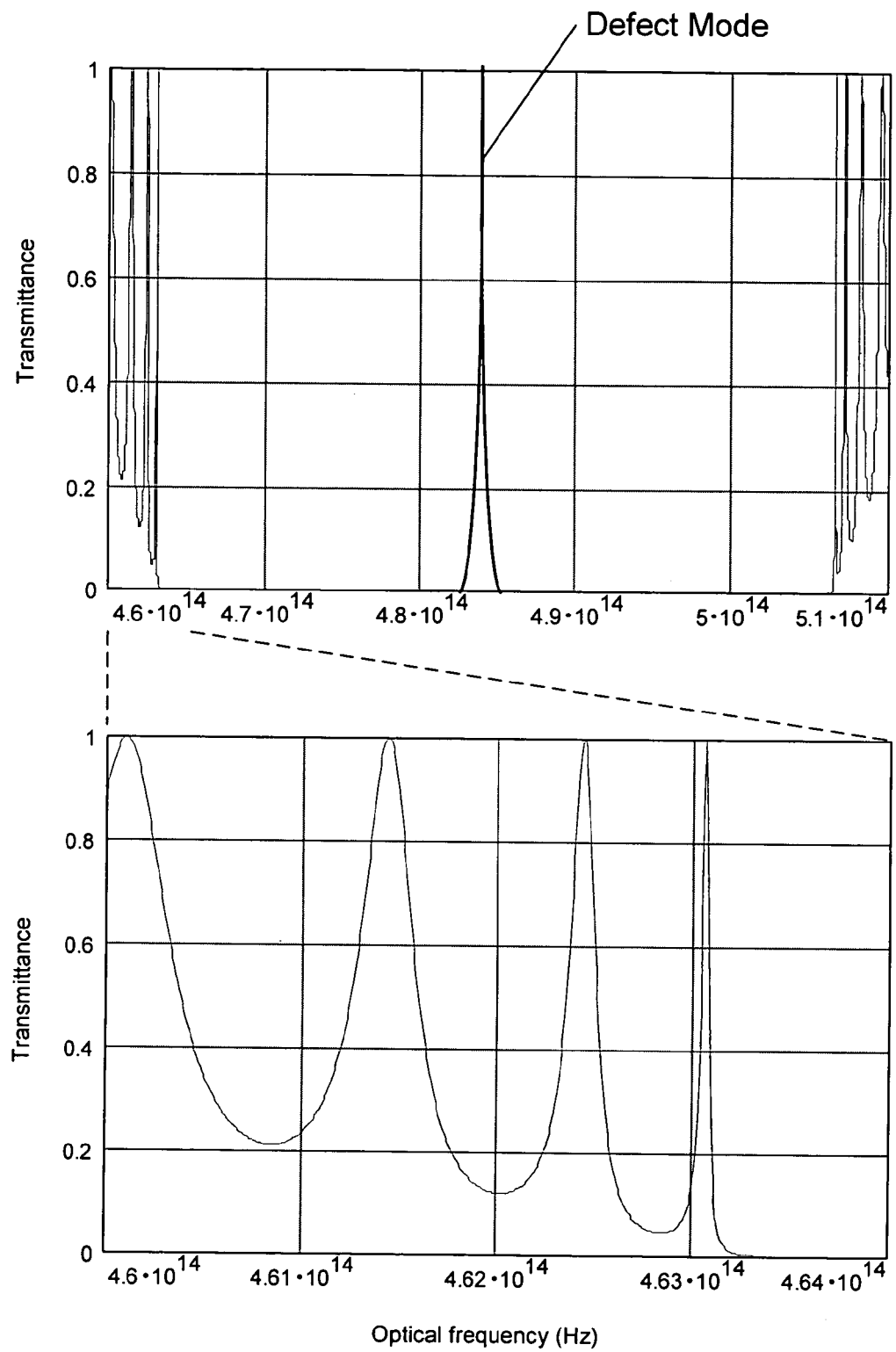
FIG. 5 is a graph diagram of a transmittance spectrum at normal incidence in accordance with the present invention.
Figure 6:
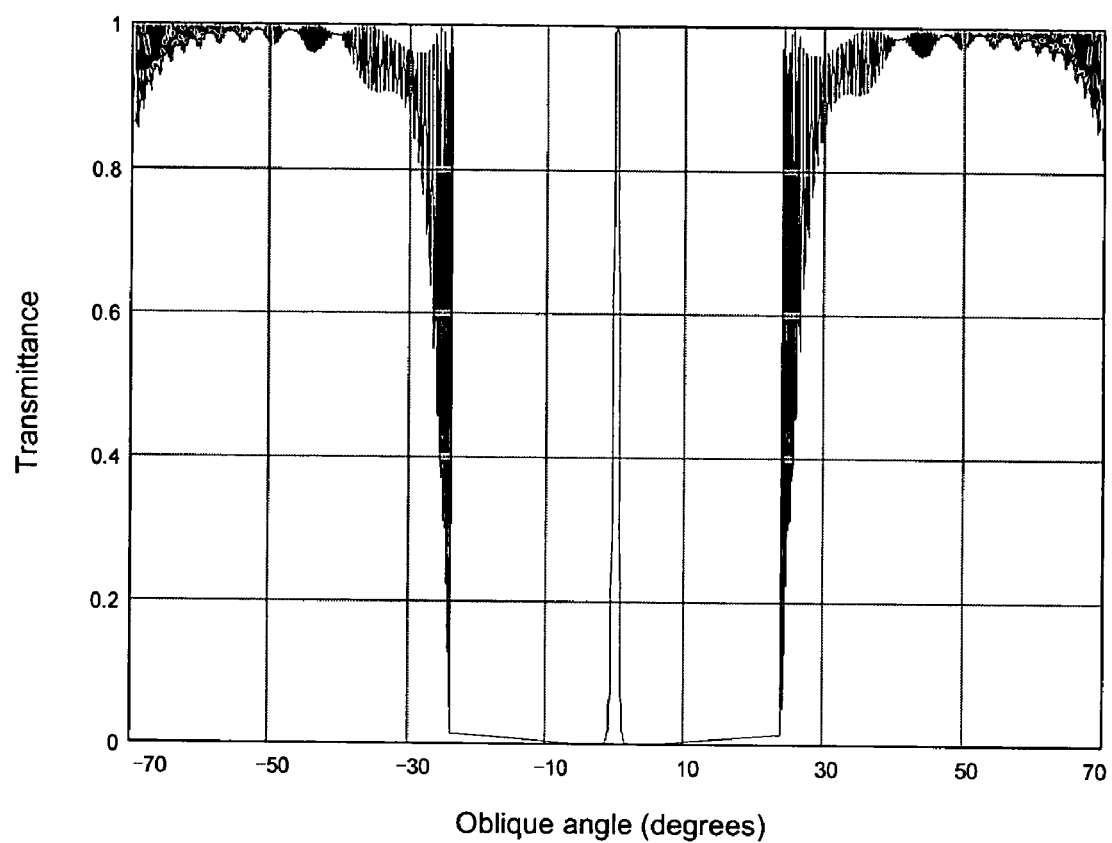
FIG. 6 is a graph diagram of transmittance versus angle at the frequency of the first mode at the high frequency band edge in accordance with the present invention.

In FIG. 5, a typical transmission spectrum is shown for a normally incident plane wave. The first peak near the high frequency side of the band gap has the smallest width. In FIG. 6 the transmission spectrum is plotted as a function of incident angle at the frequency of this band edge state. Transmission is small for off-normal waves over a wide range of angles because the waves are evanescent. This is a direct result of the shift of the band edge to the high frequency side with increasing oblique angle. The sharpness of this band-edge state leads to its having the lowest threshold for lasing. In the presence of gain, the width of this band edge state decreases with the gain coefficient and becomes zero when the critical gain is reached. At this point, both the transmission and reflection coefficients diverge. Unlike presently used lasers based on Fabry-Perot resonators, which have a series of transmission modes of nearly equal width, the band-edge and defect modes of 1-D band gap structures are significantly different than other modes. Since there are then no other propagating spectral modes, this leads to the generation of single-frequency radiation slightly above threshold.

Figure 7:
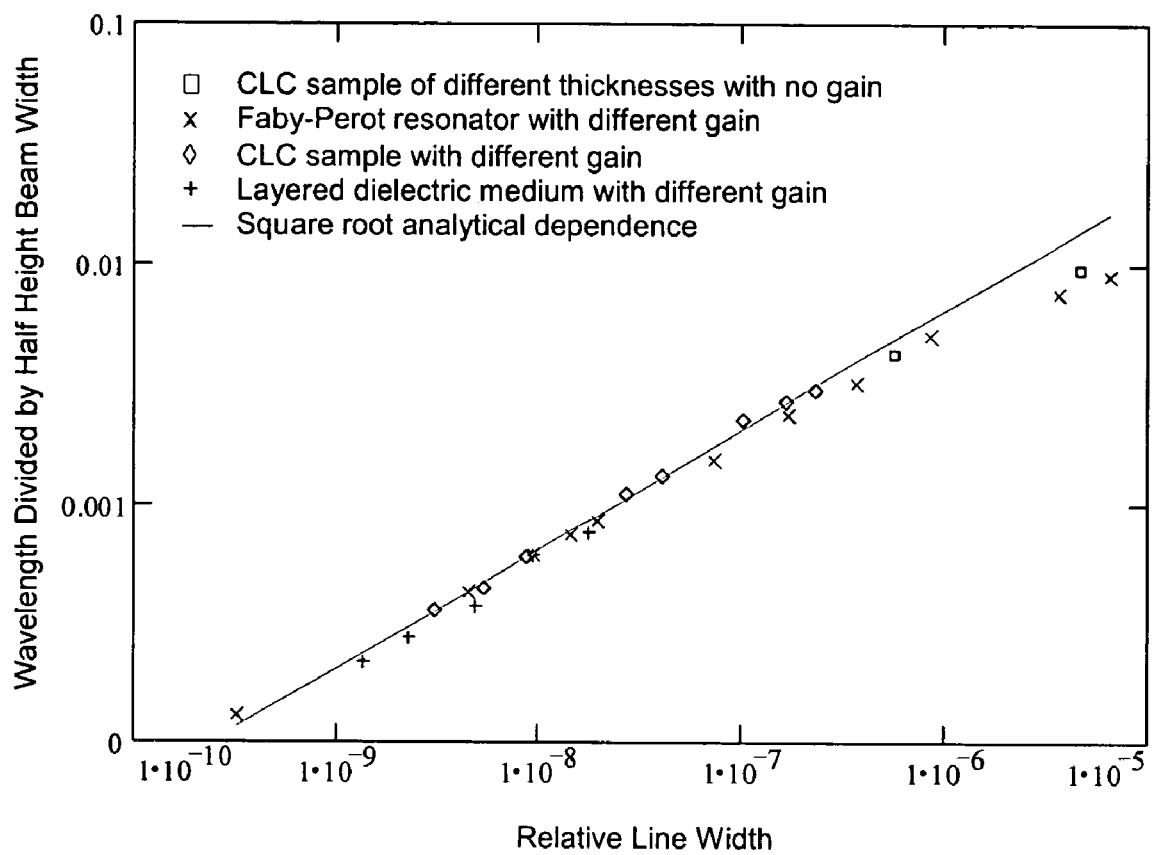
FIG. 7 is a graph diagram of universal relation of inverse beam width versus relative line width for different samples of the inventive apparatus in accordance with the present invention.

If an infinite region with constant gain in the transverse direction is assumed, at the critical gain, the transmitted wave at the output surface is a plane wave of infinite transverse extent independent of the extent of the incident beam. In practice, the gain region is always bounded and the transmitted wave is limited by the extent of the incident beam. In this case, the angular confinement of the wave will produce a modulated cylindrical pattern in the far field with an appearance similar to the Fraunhoffer diffraction pattern of plane waves by an aperture. The ring pattern can be observed even for an infinite gain region, but only below the lasing threshold. If the gain coefficient $\gamma$ is below its critical value $\gamma_c$, the electromagnetic field at the output surface has the form $\phi(x) \propto \exp[-(1-i)\alpha|x|]$, where the value of $\alpha$ is proportional to $\sqrt{\gamma_c - \gamma}$. The phase of the wave front also depends on the sample characteristics, but is independent of the spatial width of the incident beam. Thus, the intensity decays exponentially away from the point of peak intensity of the wave front and has a width of $2/\alpha$. The angular confinement, as well as the finite beam width of the wave at the output surface, produce a modulated cylindrically symmetric structure in the far field. For a gain close to its critical value, the beam width at the output surface can be much larger than that of the incident beam. The divergence of the beam inside the medium is correspondingly much greater than the diffraction divergence for such a wave in a homogeneous medium. At the output surface a single-frequency, spatially-coherent optical beam is emitted from the entire gain region perpendicular to the film surface. Since the line width is proportional to $\gamma_c - \gamma$, there is a universal relation between the beam width at the output surface W and the line width $\Delta\lambda$ at the wavelength $\lambda$ of the band edge state, $$\frac{\lambda}{nW} = \frac{\pi\sqrt{2}}{\ln 2}\sqrt{\frac{\Delta\lambda}{\lambda}}$$

where n is the averaged index of refraction of the CLC. This relation is valid not only for CLCs, but also for VCSELs and Faby-Perot oscillators. This is demonstrated in FIG. 7, where the universal relationship between $\lambda/nW$ and $\Delta\lambda/\lambda$ is confirmed for two CLC samples, for a layered dielectric medium, and for a Faby-Perot resonator. However, both small and large VCSELs have certain limitation with respect to wide-area lasing—high order transverse modes arise in small-diameter VCSEL, while in large-diameter VCSELs spontaneous filamentation results from structural nonuniformities.

It should be noted that experimentation utilizing the inventive apparatus has demonstrated that coherence area of the lasing remains stable even at output of an excitation source that provides gain substantially higher than the lasing threshold. This important property of the inventive apparatus—stability of lasing coherence over high power output occurs only when lasing at a high frequency band edge mode or at a defect mode substantially distant from the nearest lower frequency band edge mode.

Thus, the feedback structure utilized in all embodiments of the inventive apparatus should be configured (for example, by selecting a particular refractive index variation profile during fabrication thereof) to produce a photonic mode at a particular frequency F separated from a nearest lower frequency photonic mode by a frequency greater than determined in accordance with a following expression: c/2TN, wherein c is the speed of light, T is said thickness of said feedback structure and N is said average refractive index of said feedback structure. This arrangement ensures lasing coherence even when the feedback structure is subjected to gain that exceeds the lasing threshold, and enables lasing at a wider coherent area greater than the thickness T of the feedback structure.

Referring now to FIGS. 1A to 1G a variety of exemplary inventive feedback structures that produce wide coherence area lasing are shown. These structures are described in greater detail in the commonly assigned co-pending U.S. Patent Application "Chiral Laser Apparatus and Method" of Victor Kopp al. (Ser. No. 09/468,148, filed Dec. 21, 1999) which is incorporated by reference in its entirety. The CLC labels in the figures refer to cholesteric liquid crystals but may be any chiral material. Alternately, the feedback structure of the present invention may be any configuration that produces a desirable feedback structure with above-described separation between the photonic mode at frequency F and the nearest lower frequency photonic mode, for example multiple material layers of varying dielectric constants (in a periodic or random arrangement).

In summary, a light-emitting active material is disposed within the feedback structure that is excited by electrodes attached to a variable power source, or by a variable output optical pump, when the active material is optically excitable. Even when the applied gain from the power source is varied, the coherence area of lasing from the feedback structure remains stable. For optimal efficiency, preferably the active material should be selected to have highest emission at the frequency F (typically corresponding to a high frequency band edge mode or a defect mode).

Referring initially to FIG. 1A, in a first embodiment of the present invention, a wide-area coherent chiral laser 10 includes an active light-emitting material 12 for producing gain, such as a light-emitting diode (e.g. a GaAs diode), sandwiched between an upper cholesteric liquid crystal ("CLC") layer 14 and a lower CLC layer 16. The light-emitting material 12 may include, but is not limited to: laser dyes, rare earth elements, conjugated polymers or any medium in which electron-hole recombination occurs in the active material. As noted above, the CLC layers 14 and 16 may be composed from any chiral substance capable of transmitting light.

A first electrode 18 is connected to the upper CLC layer 14 and a second electrode 20 is connected to the lower CLC layer 20. Both electrodes 18 and 20 are connected to an external electrical power source 22. The tunable power source 22 may be any tunable electrical current source capable of providing charge current between electrodes connected thereto. Optionally, the CLC layers 14 and 16 and the light-emitting layer 12 may all be incorporated into a single conjugated polymer having a structure of a CLC.

When a voltage $V\_1$ is applied between electrodes 18 and 20 by the tunable power source 22, a charge current passes through the light-emitting material 12, exciting it and causing emission of electromagnetic radiation that through stimulated emission causes polarized wide-area lasing at a predefined lasing wavelength. Advantageously, even when the output of the tunable power source 22 is varied above the lasing threshold, the coherence of the resulting laser beam remains stable. In contrast, at higher excitation power output, conventional lasers lose coherence and suffer from filamentation (i.e. splitting of the coherent beam into multiple beams). This is a very undesirable property in nearly all applications.

Because the charge current must pass through both CLC layers 14 and 16, preferably, the CLC layers 14 and 16 are substantially conductive. Optionally, the upper CLC layer 14 is configured to conduct electrons, while the lower CLC layer 16 is configured to conduct holes. When voltage $V\_1$ is applied by the power source 22, electrons and holes flow into the light-emitting material 12 and recombine to emit light. Lasing occurs in a direction perpendicular to the CLC layers 14 and 16. The pitches of the CLC layers 14 and 16 are preferably substantially identical. Alternately, the pitches of the CLC layers 14 and 16 may be varied by application of heat, temperature, and/or pressure to shift the photonic stop band, and thus to tune the lasing wavelength.

The wavelength at which lasing occurs and the lasing threshold and efficiency depend on a number of factors. If the light-emitting material 12 is much thinner than the wavelength of light and if the CLC layers 14 and 16 are substantially identical, then lasing occurs at a wavelength corresponding to a photonic state at one of the edges of the photonic stop band. However, in the majority of cases, the light-emitting material 12 functions as a defect and thus causes a localized photonic state within the photonic stop band. Since the dwell time of photons emitted into the localized state in a CLC medium having a defect is greatly enhanced over the photon dwell time in a homogeneous CLC medium, the intensity of the light inside the medium is greatly enhanced and is peaked at the position of the localized state. Thus, to advantageously achieve maximum lasing efficiency and power, the light-emitting material 12 should be placed in a position between the CLC layers 14 and 16 such that the peak gain emission of the light-emitting material 12 coincides with the position of the localized photonic state (resulting from the defect) in the photonic stop band. To further centralize the localized photonic state within the photonic stop band so that it corresponds with peak gain of the emission band of the light-emitting material 12, the size of the light-emitting material 12 should be approximately one quarter of a wavelength of light inside the feedback structure formed by the CLC layers 14 and 16 and the light-emitting material 12. As previously noted, the light-emitting material 12 should be selected to have optimal emission at frequency F.

Figure 1B:
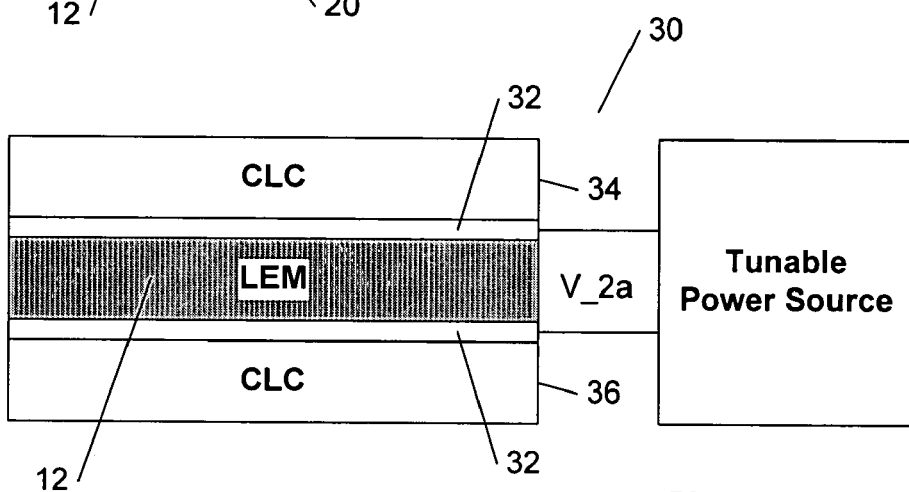
FIG. 1B is a schematic diagram of a second embodiment of a feedback laser of the present invention wherein the feedback laser is electrically pumped.

Referring now to FIG. 1B, a second embodiment of the invention is shown as a chiral laser 30. The chiral laser 30 includes an active light-emitting material 12 for producing gain, sandwiched between an upper CLC layer 34 and a lower CLC layer 36. As noted above, the CLC layers 34 and 36 may be composed from any chiral substance capable of transmitting light.

A first electrode 32 is positioned between the upper CLC layer 34 and the light-emitting material 12, while a second electrode 32 is positioned between the light-emitting material 12 and the lower CLC layer 36. Both electrodes 32 are connected to the external electrical power source 22. When a voltage V_2a is applied between electrodes 32 by the power source 22, a charge current passes through the light-emitting material 12, exciting it and causing spontaneous and stimulated emission of electromagnetic radiation that results in polarized lasing at a predefined lasing wavelength. Lasing occurs in a direction perpendicular to the CLC layers 34 and 36. The pitches of the CLC layers 34 and 36 are preferably substantially identical. Alternately, the pitches of the CLC layers 34 and 36 may be varied by application of heat, voltage, temperature, and/or pressure to shift the photonic stop band and thus to tune the lasing wavelength.

The chiral laser 30 operates substantially in a similar manner to the chiral laser 10 with the exception of the following differences. Because the charge current is applied directly to the light-emitting material 12, the CLC layers 34 and 36 need not be conductive. Furthermore, V_2a can be significantly lower than V_1 of FIG. 1A because the charge current does not need to overcome the resistance of two CLC layers. Both of these factors decrease the complexity and power requirements of the chiral laser 30. However, because light must pass through both electrodes 32, the electrodes 32 must be substantially transparent. A lower electrode transparency directly results in optical loss which can inhibit lasing. Because perfectly transparent electrodes do not currently exist, the chiral laser 30 may be less efficient than the chiral laser 10.

Figure 1C:
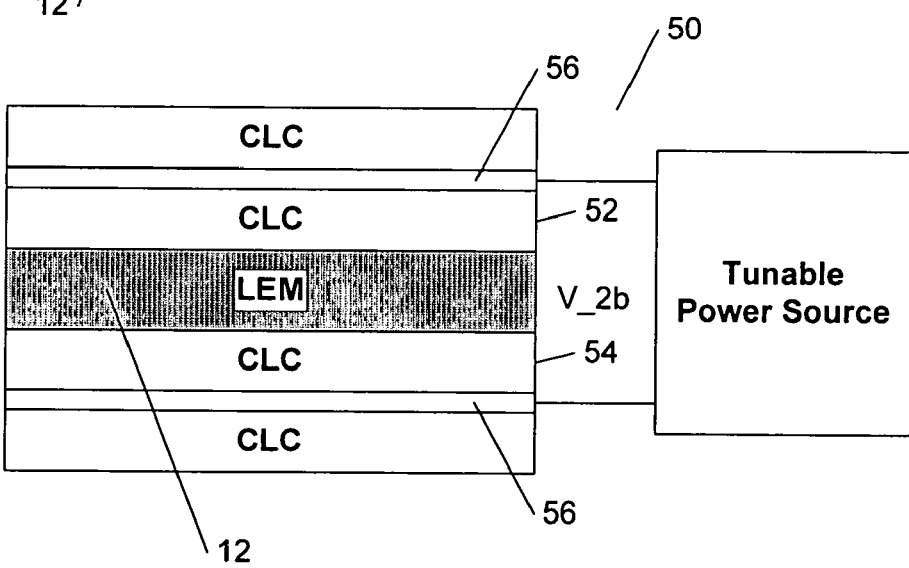
FIG. 1C is a schematic diagram of a third embodiment of a feedback laser of the present invention wherein the feedback laser is electrically pumped.

Referring now to FIG. 1C, a third embodiment of the present invention is shown as a chiral laser 50. The chiral laser 50 includes an upper CLC layer 52, a light-emitting material layer 12, a lower CLC layer 54, a first electrode 56 embedded within the upper CLC layer 52 and a second electrode 56 embedded within the lower CLC layer 54. Both electrodes are connected to the power source 22. The chiral laser 50 operates substantially in a similar manner to the chiral laser 30 except that the electrodes 56 need not be as transparent as electrodes 32, and the CLC layers 52 and 54 must be conductive. The voltage V_2b applied by the power source 22 is between V_1 and V_2a. Thus, the chiral laser 50 is less sensitive to the transparency of the electrodes than the chiral laser 30, but requires a higher voltage and more complex fabrication techniques.

Figure 1D:
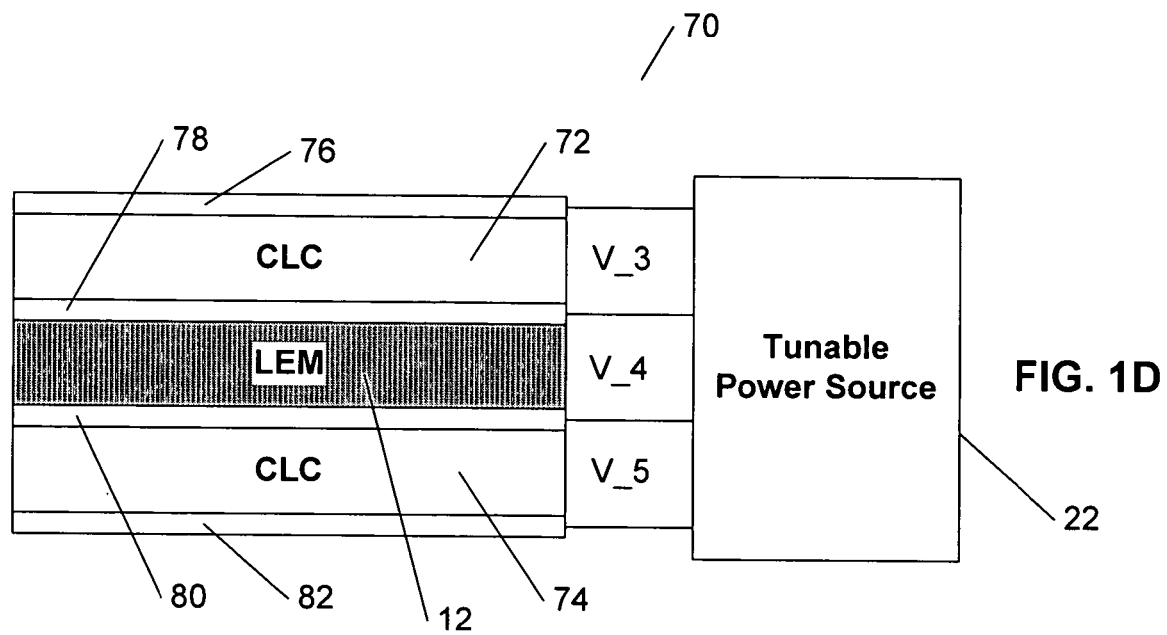
FIG. 1D is a schematic diagram of a fourth embodiment of a feedback laser of the present invention wherein the feedback laser is electrically pumped.

Referring now to FIG. 1D, a fourth embodiment of the present invention is shown as a chiral laser 70. The chiral laser 70 includes an active light-emitting material 12 for producing gain, sandwiched between an upper CLC layer 72 and a lower CLC layer 74. The light-emitting material 12 may include, but is not limited to: laser dyes, rare earth elements, conjugated polymers or any other medium in which electron-hole recombination occurs in the active material. As noted above, the CLC layers 72 and 74 may be composed from any chiral substance capable of transmitting light. Preferably, the CLC layers 72 and 74 are substantially conductive. The upper CLC layer 72 is sandwiched between a first electrode 76 and a second electrode 78, the light-emitting material 12 is sandwiched between the second electrode 78 and a third electrode 80, and the lower CLC layer 74 is sandwiched between the third electrode 80 and a fourth electrode 82. All electrodes 76, 78, 80, 82 are connected to the power source 22. Preferably, electrodes 78 and 80 are substantially transparent. One or both of the electrodes 76 and 82 may be substantially transparent depending on the desired lasing direction. The chiral laser 70 can operate in a similar manner to chiral laser 10 when voltage is applied between electrodes 76 and 82, or in a similar manner to chiral laser 30 when a voltage V_4 is applied between electrodes 78 and 80.

Figure 1E:
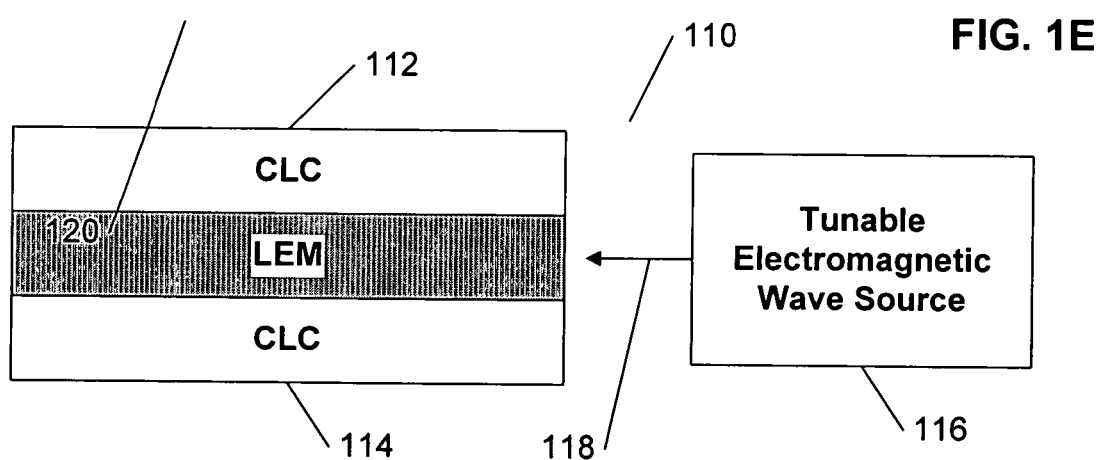
FIG. 1E is a schematic diagram of a fifth embodiment of a feedback laser of the present invention wherein the feedback laser is optically pumped.

Referring now to FIG. 1E, a fifth embodiment of the present invention is shown as a chiral laser 110. The chiral laser 110 includes an active optically excitable light-emitting material 120 for producing gain when subjected to an electromagnetic wave, sandwiched between an upper CLC layer 112 and a lower CLC layer 114. The active optically excitable light-emitting material 120 may comprise, but is not limited to: rare earth doped material, chelated rare earth doped material, semiconductor materials, organic light-emitting materials, conjugated polymers, dye-doped material, and materials containing color centers. As previously noted, the light-emitting material 120 should be selected to have optimal emission at frequency F. As noted above, the CLC layers 112 and 114 may be composed from any chiral substance capable of transmitting light. An electromagnetic wave source 116, such as a laser, a flash lamp, focused sunlight, or light-emitting diode radiates an electromagnetic wave 118 to excite the active optically excitable light-emitting material 120 and to thereby cause lasing in a manner similar to the chiral laser 10 of FIG. 1A. Alternatively, the electromagnetic wave source 116 may comprise an electroluminescent material embedded within the active optically excitable light-emitting material 120 such that when the electro-luminescent material is electronically pumped from an external power source (not shown), the electro-luminescent material emits an electromagnetic wave to excite the active optically excitable light-emitting material 120.

Figure 1F:
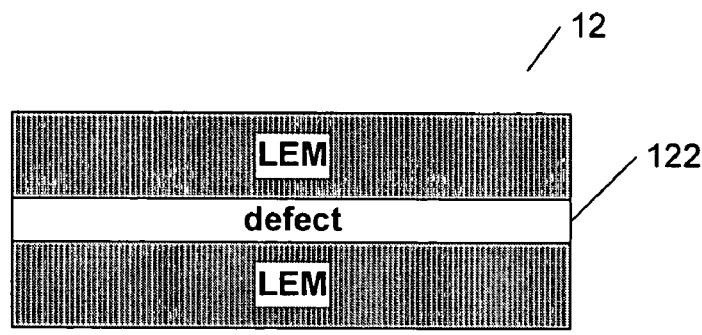
FIG. 1F is a schematic diagram of a light-emitting material layer of FIGS. 1A to 1E having a defect introduced therein in accordance with the present invention.

Referring to FIG. 1F, an exemplary light-emitting material 12 having an artificially formed defect 122 therein is shown. The defect 122 may be physical spacing, or a dielectric structure with a different refractive index from the light-emitting material. The light-emitting material 12 of FIG. 1G can be utilized in any of the embodiments of the present invention illustrated in FIGS. 1A to 1E where lasing at a localized photon state at the frequency F within the photonic stop band is desirable. An exemplary localized state, i.e. defect mode, is shown in the top transmission spectrum graph of FIG. 5. Preferably, the defect 122 is configured such that the overall thickness of the light-emitting material 12 is approximately one quarter of a wavelength of light inside the feedback structure formed by the upper and lower CLC layers and the light-emitting material 12.

Figure 1G:
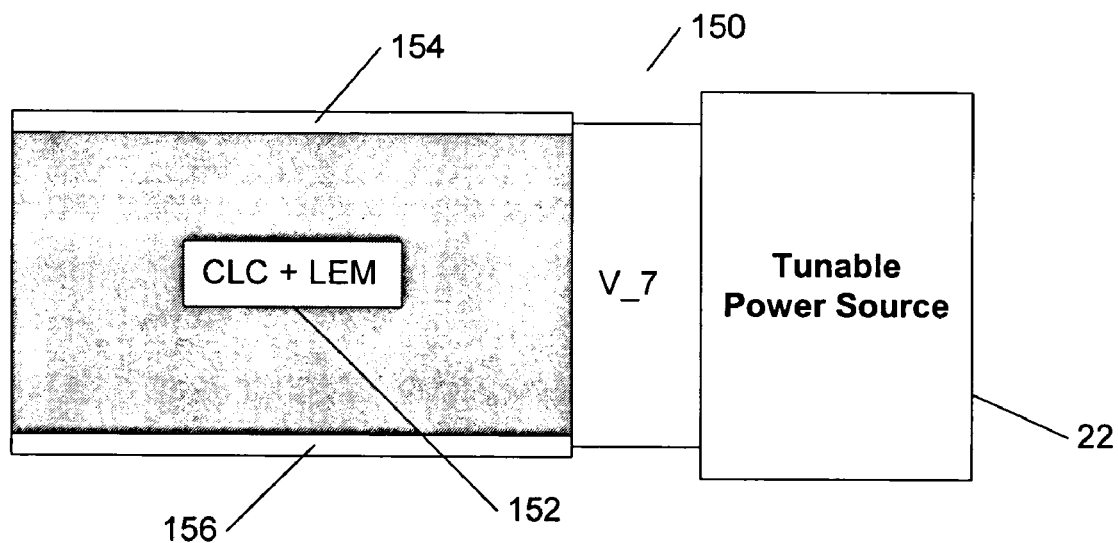
FIG. 1G is a schematic diagram of a sixth embodiment of a feedback laser of the present invention wherein the feedback laser is electrically pumped.

Referring now to FIG. 1G, a sixth embodiment of the present invention is shown as a chiral laser 150. The chiral laser 150 differs from the previously described embodiments in that instead of a feedback CLC and light-emitting material structure, the chiral laser 150 includes a single CLC layer 152 doped with a light-emitting electrically excitable material, such as materials utilized in the light-emitting material 12 of FIG. 1A, sandwiched between electrodes 154 and 156. The electrodes 154 and 156 are connected to the power source 22. When a voltage V_7 is applied by the power source 22 between the electrodes 154 and 156, a charge current passes through the doped CLC layer 152 and excites the light-emitting material distributed therein causing lasing perpendicular to the doped CLC layer 152. Because the CLC layer 152 is homogeneous and without a defect, the most advantageous lasing wavelength is centered at the edge of the photonic stop band of the structure. Preferably, the light-emitting material distributed throughout the doped CLC layer 152 is selected such that the peak gain emission corresponds, or is close to, the high frequency band edge of the photonic stop band (i.e. at the frequency F).

Figure 2A:
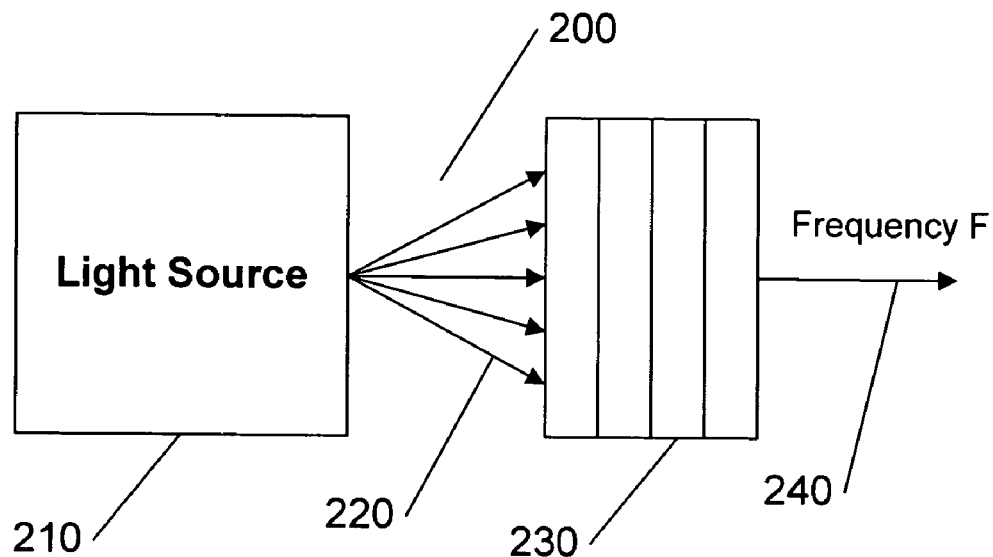
FIG. 2A is a schematic diagram of a first passive filter embodiment of the present invention.

In another embodiment, the apparatus of the present invention can be utilized as a passive spatial filter without requiring an active excitable material or a power source. This embodiment is shown in FIG. 2A as filter system 200. A light source 210 emits light 220 at the predetermined frequency F which encompasses a range of wave vectors. The feedback structure 230 only permits transmission of light of the frequency F that is within a very narrow range in angle about the normal vector to the surface of the structure 230. This filtered light is shown as beam 240 of frequency F. Thus, the inventive apparatus 200 can be advantageously utilized as a passive spatial filter for light of a predefined frequency F.

Figure 2B:
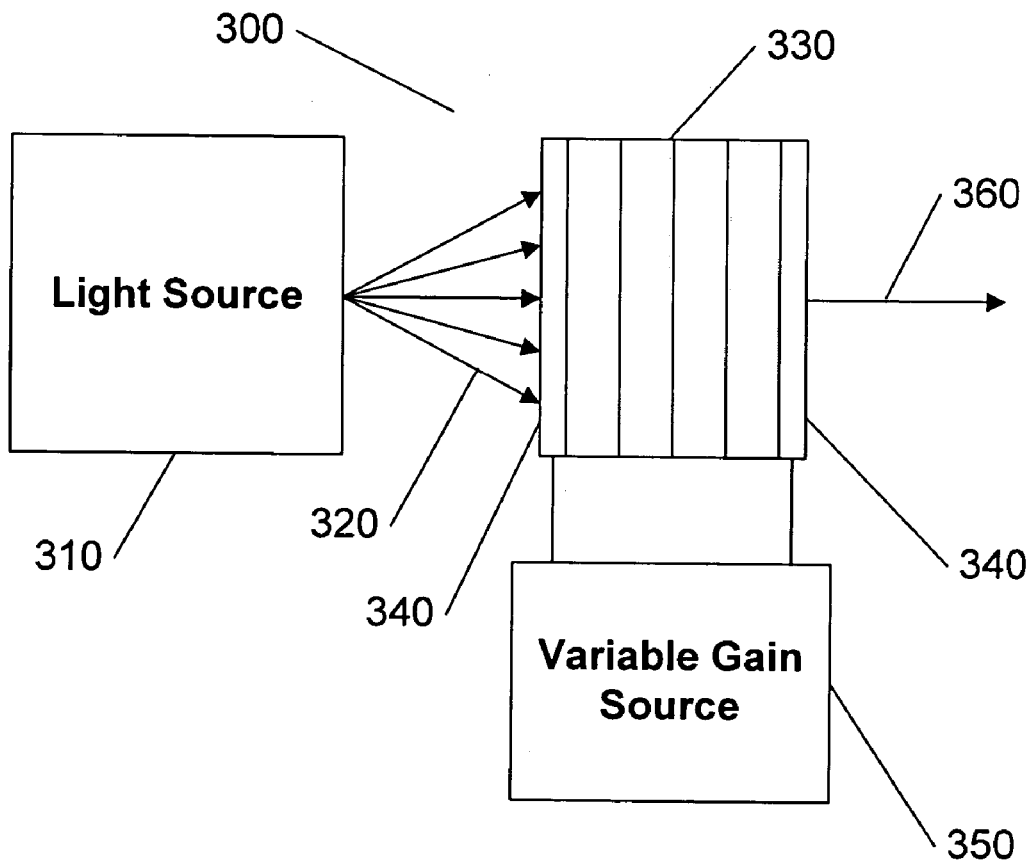
FIG. 2B is a schematic diagram of a first active amplifier embodiment of the present invention.

In yet another embodiment, the apparatus of the present invention can be utilized as an active amplifier with tunable coherence area. This embodiment is shown in FIG. 2B as an amplifier system 300. A light source 310 emits light 320 through the feedback structure 330. Variable gain is applied by variable gain source 350 via electrodes 340. Optionally, the variable gain source may be an optical pump in contact with the feedback structure 330 in which case electrodes 340 are not necessary. Preferably, the variable gain is applied below the lasing threshold such that light 320 at the frequency F passing through the feedback structure 330 is amplified into a light beam 360. In accordance with the present invention the gain from the variable gain source 350 may be varied to advantageously control amplification and the coherence area of the resulting beam 360.

Figure 3:
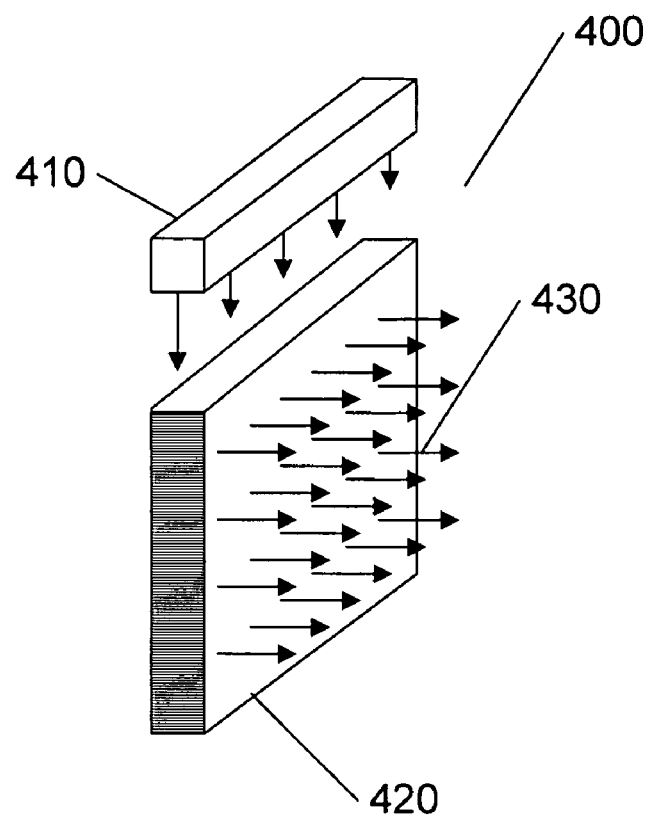
FIG. 3. is a schematic diagram of a light diffuser panel light source utilized in several embodiments of the present invention.

Referring now to FIG. 3, instead of a typical light source, a light diffusing panel ("LDP") light source 400 may be advantageously utilized in the embodiments of previous FIGS. 1E and 2B in accordance with the present invention. The LDP light source comprises a light-emitter 410, such as an LED strip for emitting light in a particular direction, and a diffusing panel 420 configured, such that when light is emitted from the emitter 410 into an edge of the diffusing panel 420, light 430 is emitted from the panel 420 surface perpendicular to the emission direction of the emitter 410. While only a single emitter 410 is shown along the top edge of the, as a matter of design choice, the emitter 410 may be positioned along any edge of the diffusing panel 420 without departing from the spirit of the present invention. Furthermore, more than one emitter may be utilized with a single emitter positioned along each of the two, three or all four edges of the diffusing panel 420 (not shown). Optionally, the emitter 410 may be positioned and directed at the back surface of the diffuser panel 420 rather than at one of its edges (not shown). Preferably, the emitter 410 has controllable variable light output.

The diffuser panel 420 may be selected from a variety of diffuser panels as a matter of design choice—for example the diffuser panel may be a light shaping diffuser holographic panel. While light 430 is shown to be at a substantially normal direction from the panel 420 surface and evenly distributed, it should be noted that the angle and distribution of the light 430 may be changed by different configuration selecting the diffuser panel 420 of a different configuration as a matter of design choice. It should also be noted that even though the FIG. 3 shows light vectors substantially normal to the surface of the diffuser panel 420, in practice there is some dispersion of the light away from the normal vector. The LDP light source 400 is advantageous as an optical pump because it produces uniform light over a large area thus providing uniform optical pumping.

Figure 4:
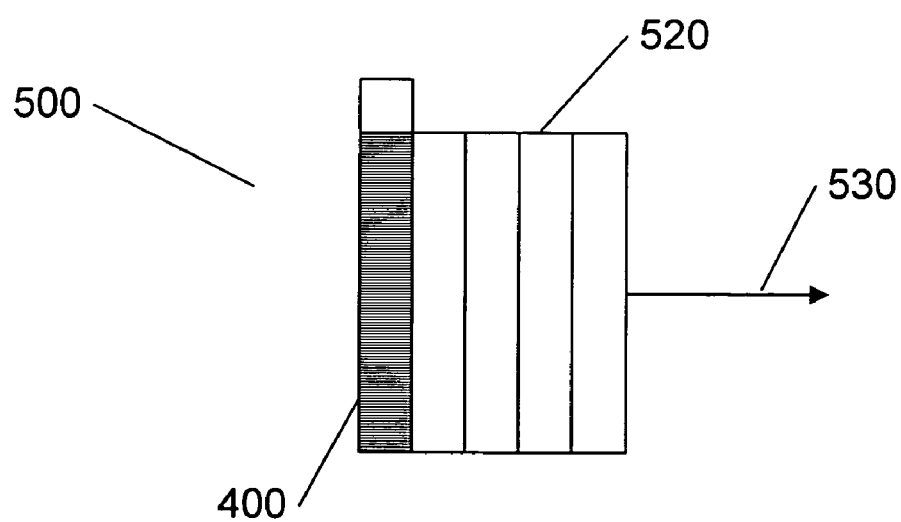
FIG. 4 is a schematic graph diagram of an alternate lasing apparatus embodiment of the present invention.

In an alternate lasing apparatus embodiment of the present invention, the LDP light source 400 is utilized as an optical pump. This embodiment is shown in FIG. 4 as a laser 500. The LDP light source 400 emits light at a distributed substantially normal vector into a feedback structure 520. The feedback structure 520 is preferably doped with optically excitable materials. Variable gain is applied by adjusting the emitter 410 of the LDP light source 400. Preferably, the variable gain is applied above a lasing threshold such that lasing light 530 is produced. Because the diffuser panel 420 only emits light at an approximately normal vector, the structure 520 provides an excellent wide-area coherent lasing medium. In accordance with the present invention even when gain is varied substantially above the lasing threshold, the coherence area of the resulting lasing beam 530 remains the same.

Thus, while there have been shown and described and pointed out fundamental novel features of the invention as applied to preferred embodiments thereof, it will be understood that various omissions and substitutions and changes in the form and details of the devices and methods illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. It is the intention, therefore, to be limited only as indicated by the scope of the claims appended hereto.

We claim:

1. A laser apparatus for producing single mode large-area coherent lasing, comprising:
   a feedback structure of a thickness T and of an average refractive index N, having a top surface and a bottom surface, said feedback structure having a refractive index variation between said top and said bottom surfaces in accordance with a predefined profile, such that said structure produces a photonic mode having a lasing threshold and being of a predetermined frequency, and a plurality of additional photonic modes, wherein said predefined profile is selected such that said predetermined frequency is greater than a value determined by a following expression:

$F_L + c/2TN$, wherein $F_L$ is a frequency of a nearest, to said predetermined frequency, lower frequency photonic mode of said plural additional photonic modes, and c is the speed of light in a vacuum;
   a light-emitting medium disposed within said feedback structure, said light-emitting medium being configured to emit electromagnetic radiation at said predetermined frequency; and
   variable excitation means, connected to said feedback structure, for exciting said light-emitting medium to produce optical gain of a predetermined gain magnitude in said feedback structure, said predetermined gain magnitude being sufficient to at least meet said lasing threshold to cause coherent wide-area laser emission to occur at said predetermined frequency perpendicular to at least one of said top and bottom surfaces, wherein said wide-area laser emission remains coherent when said predetermined gain magnitude is selectively increased above said lasing threshold.

2. The laser apparatus of claim 1, wherein said photonic mode is one of a defect mode and a high frequency band edge mode.

3. The laser apparatus of claim 1, wherein said feedback structure comprises a plurality of dielectric material layers of at least two differing dielectric constants.

4. The laser apparatus of claim 1, wherein said light-emitting medium is composed of a material adapted to produce optical gain inside said feedback structure upon application of an electromagnetic wave thereto, and wherein said variable excitation means comprises an electromagnetic wave source configured to apply said electromagnetic wave to said feedback structure to excite said light-emitting medium to produce optical gain.

5. The laser apparatus of claim 4, wherein said electromagnetic wave source is one of: a laser, a flash lamp, focused sunlight, a light-emitting diode, and an electrically pumped electro-luminescent material embedded within said light-emitting medium.

6. The laser apparatus of claim 5, wherein said light-emitting medium comprises one of: rare earth doped material, chelated rare earth doped material, semiconductor materials, organic light-emitting materials, conjugated polymers, dye-doped material, and materials containing color centers.

7. The laser apparatus of claim 4, wherein said electromagnetic wave source comprises:
  a diffuser having a plurality of edges and an emitting surface perpendicular to said plural edges; and
  a tunable light-emitter operable to emit electromagnetic radiation into at least one of said plural edges such that electromagnetic radiation is scattered and emitted from said emitting surface, said emitted electromagnetic radiation being dispersed along said emitting surface and being generally perpendicular to one of said top and bottom surfaces of said feedback structure, and wherein when said predetermined gain magnitude resulting from excitation of said light-emitting medium by said electromagnetic radiation is above said lasing threshold, said feedback structure only produces laser emission at said predetermined frequency and having a wave vector substantially normal to at least one of said top and bottom surfaces.

8. The laser apparatus of claim 7, wherein said tunable light emitter comprises at least one LED strip positioned along and corresponding to at least one of said plural edges, each of said at least one LED strips being tunable to provide variable light output.

9. The laser apparatus of claim 4, wherein said electromagnetic wave source comprises:
  a diffuser having an emitting surface for contact with said top surface of said feedback structure and having a back surface; and
  a tunable light-emitter operable to emit electromagnetic radiation into said back surface such that said electromagnetic radiation is scattered and emitted from said emitting surface, said emitted electromagnetic radiation being dispersed along said emitting surface and being generally perpendicular to said top surface of said feedback structure, and wherein when predetermined gain magnitude resulting from excitation of said light-emitting medium by said electromagnetic radiation is above said lasing threshold, said feedback structure only produces laser emission from said bottom surface at said predetermined frequency and having a wave vector substantially normal to said bottom surface.

10. The laser apparatus of claim 1, wherein said light-emitting medium is composed of a material adapted to produce optical gain inside said feedback structure upon application of a charge current thereto, and wherein said variable excitation means comprises:
  a plurality of electrodes connected to said feedback structure; and
  a tunable electrical power source, connected to said plurality of electrodes for providing said charge current to said feedback structure to excite said light-emitting medium to produce optical gain inside said feedback structure.

11. A passive spatial electromagnetic radiation filter apparatus comprising:
  a feedback structure having a top portion and a bottom portion of a thickness T and having an average refractive index N, said feedback structure being configured to produce a photonic mode of a predetermined frequency, said photonic mode being separated from a nearest lower frequency photonic mode by a frequency greater than determined in accordance with a following expression: c/2TN, wherein c is the speed of light in a vacuum; and
  a source for emitting electromagnetic radiation at said predetermined frequency within a cone that is generally perpendicular to said feedback structure through said feedback structure, wherein said feedback structure only transmits electromagnetic radiation of said predetermined frequency and having a wave vector substantially normal thereto, such that said electromagnetic radiation is passively spatially filtered as it passes through said feedback structure.

12. The passive spatial electromagnetic radiation filter of claim 11, wherein said photonic mode is one of a defect mode and a high frequency band edge mode.

13. An electromagnetic radiation amplifier apparatus comprising:
  a feedback structure having a top portion and a bottom portion of a thickness T and having an average refractive index N, said feedback structure being configured to produce a photonic mode of a predetermined frequency, said photonic mode being separated from a nearest, to said predetermined frequency, lower frequency photonic mode by a frequency greater than determined in accordance with a following expression: c/2TN, wherein c is the speed of light in a vacuum;
  a light-amplifying medium disposed within said feedback structure and being configured to amplify electromagnetic radiation at said predetermined frequency;
  an electromagnetic radiation source for emitting electromagnetic radiation at said predetermined frequency perpendicular to said feedback structure through said first surface of said feedback structure into said structure, such that a beam emerges through said second surface, wherein said feedback structure only transmits electromagnetic radiation of said predetermined frequency having a wave vector substantially normal thereto; and
  variable excitation means, connected to said feedback structure, for applying gain of a selected magnitude to said feedback structure to thereby externally control a coherence area of said emerging beam, wherein said gain:
   a) ranges from a lower gain to a higher gain,
   b) is below a lasing threshold, and
   c) is sufficient to provide amplification for said emitted electromagnetic radiation at said predetermined frequency such that when said gain is changed between said lower gain and said higher gain, said electromagnetic radiation emitted from said second surface is amplified and changed in coherence area corresponding to said change in said gain.

14. The electromagnetic radiation amplifier apparatus of claim 13, wherein said photonic mode is one of a defect mode and a high frequency band edge mode.

15. The electromagnetic radiation amplifier apparatus of claim 13, wherein said feedback structure comprises a plurality of dielectric material layers of at least two differing dielectric constants.

16. A method for producing single mode large-area coherent lasing, comprising the steps of:
   a) providing a feedback structure of a thickness T and of an average refractive index N, having a top surface and a bottom surface, said feedback structure having refractive index variation, between said top and said bottom surfaces in accordance with a predefined profile;
   b) configuring said feedback structure by selecting said predefined profile such that said structure produces a photonic mode having a lasing threshold and being of a predetermined frequency, and a plurality of additional photonic modes of different frequencies, wherein said predefined profile is selected such that said predetermined frequency is greater than a value determined by a following expression:

$F_L + c/2TN,$ wherein $F_L$ is a frequency of a nearest, to said predetermined frequency, lower frequency photonic mode of said plural additional photonic modes, and c is the speed of light in a vacuum;
   c) providing a light-emitting medium disposed within said feedback structure, said light-emitting medium being configured to produce optical gain when subjected to excitation; and
   d) exciting said light-emitting medium to produce said optical gain of a predetermined gain magnitude in said feedback structure, said predetermined gain magnitude being sufficient to at least meet said lasing threshold, such that coherent wide-area laser emission occurs at said predetermined frequency perpendicular to at least one of said top and bottom surfaces, wherein said wide-area laser emission remains coherent when said predetermined gain magnitude is selectively increased above said lasing threshold.

17. The method of claim 16, wherein said photonic mode is one of a defect mode and a high frequency band edge mode.

18. A method for passively spatially filtering electromagnetic radiation utilizing a feedback structure, comprising the steps of:
   a) providing a feedback structure of a thickness T and of an average refractive index N, having a top surface and a bottom surface, said feedback structure having refractive index variation, between said top and said bottom surfaces in accordance with a predefined profile;
   b) configuring said feedback structure by selecting said predefined profile such that said structure produces a photonic mode having a lasing threshold and being of a predetermined frequency, and a plurality of additional photonic modes of different frequencies, wherein said predefined profile is selected such that said predetermined frequency is greater than a value determined by a following expression:

$F_L + c/2TN,$ wherein $F_L$ is a frequency of a nearest, to said predetermined frequency, lower frequency photonic mode of said plural additional photonic modes, and c is the speed of light in a vacuum; and
   c) emitting electromagnetic radiation, from an electromagnetic radiation source, at said predetermined frequency within a cone that is generally perpendicular to said feedback structure through said feedback structure, wherein said feedback structure only transmits electromagnetic radiation of said predetermined frequency and having a wave vector substantially normal thereto, such that said electromagnetic radiation is passively spatially filtered as it passes through said feedback structure.

19. The method of claim 18, wherein said photonic mode is one of a defect mode and a high frequency band edge mode.

20. A method for amplifying electromagnetic radiation utilizing a feedback structure comprising the steps of:
   a) providing a feedback structure of a thickness T and of an average refractive index N, having a top surface and a bottom surface, said feedback structure having refractive index variation, between said top and said bottom surfaces in accordance with a predefined profile;
   b) configuring said feedback structure by selecting said predefined profile such that said structure produces a photonic mode having a lasing threshold and being of a predetermined frequency, and a plurality of additional photonic modes of different frequencies, wherein said predefined profile is selected such that said predetermined frequency is greater than a value determined by a following expression:

$F_L + c/2TN,$ wherein $F_L$ is a frequency of a nearest, to said predetermined frequency, lower frequency photonic mode of said plural additional photonic modes, and c is the speed of light in a vacuum; and
   c) providing a light-amplifying medium disposed within said feedback structure and being configured to amplify electromagnetic radiation at said predetermined frequency;
   d) emitting electromagnetic radiation, from an electromagnetic radiation source, at said predetermined frequency perpendicular to said feedback structure through said first surface of said feedback structure into said structure, such that a beam emerges through said second surface, wherein said feedback structure only transmits electromagnetic radiation of said predetermined frequency having a wave vector substantially normal thereto; and
   e) applying gain of a selective magnitude to said feedback structure, from a variable excitation device, to thereby externally control a coherence area of said emerging beam, wherein said gain:
      1) ranges from a lower gain to a higher gain,
      2) is below a lasing threshold, and
      3) is sufficient to provide amplification for said emitted electromagnetic radiation at said predetermined frequency such that when said gain is selectively changed between said lower gain and said higher gain, said electromagnetic radiation emitted from said second surface is amplified and changed in coherence area corresponding to said change in said gain.

21. The method of claim 20, wherein said photonic mode is one of a defect mode and a high frequency band edge mode.

* * * * *